United States Patent [19]

Egozi et al.

[11] Patent Number: 4,888,552
[45] Date of Patent: Dec. 19, 1989

[54] MAGNETIC RESONANCE IMAGING

[75] Inventors: Avihai Egozi, Netanya; Saul Stokar, Raanana, both of Israel

[73] Assignee: Elscint Ltd., Haifa, Israel

[21] Appl. No.: 293,767

[22] Filed: Jan. 5, 1989

[51] Int. Cl.⁴ .......................................... G01R 33/20
[52] U.S. Cl. ................................................. 324/309
[58] Field of Search ..................... 324/307, 309, 312

[56] References Cited
U.S. PATENT DOCUMENTS 4,709,211 11/1987 Machida et al. .................... 324/309
4,796,635 1/1989 Dumoulin .......................... 324/309

Primary Examiner—Stewart J. Levy
Assistant Examiner—Kevin D. O'Shea
Attorney, Agent, or Firm—Sandler and Greenblum

[57] ABSTRACT

A method of acquiring data for use in providing magnetic resonance images (MRI) wherein prior to stabilization of the system, data is acquired using phase encoding gradient pulses far removed from zero. Immediately after system stabilization data proximate and equal to the zero value phase encoding gradient pulse is acquired.

24 Claims, 4 Drawing Sheets

MAGNETIC RESONANCE IMAGING

FIELD OF THE INVENTION

This invention is concerned with magnetic resonance imaging (MRI) methods and systems and more particularly with methods and systems for obtaining magnetic resonance images during data acquisition in an on line manner practically from the onset of the acquisition process.

BACKGROUND OF THE INVENTION

Data acquisition using MRI systems, in the past required that the data acquisition be substantially completed prior to image reconstruction. In the reconstruction of the images the data is generally transformed using two-dimensional Fourier transforms. The data acquisition scan in the past proceded from an edge of a two-dimensional Fourier transform plane through the center of the plane to an opposite edge. Most of the large data points are found around the center of the Fourier transform plane. Thus, it has been necessary for the MRI system to first acquire at least half of the data prior to processing the data to provide the image.

More recently apparatus and methods (see, for example, U.S. Pat. No. 4,721,972) have been promulgated wherein the acquisition proceeds from the center of the Fourier transform plane outward enabling the almost immediate processing of the data to provide the image.

However, experience has shown that acquisition from the center outwards may cause an artifact, including a streak-like artifact emanating from any sharp boundary in the image. Such artifacts stem from the fact that when the most significant data points were acquired (the zero encoding), the system had not yet reached a state of dynamic equilibrium. This may occur because various hardware components take time for each equilibrium, or, more importantly, because the eddy currents generated by the switched gradients take time to reach equilibrium. Thus, it would seem advantageous to acquire the less significant data points at the start, and delay acquisition of the largest data points until we are certain the system has reached its equilibrium state.

There is yet another reason for slightly delaying the acquisition of the zero encoding cycle. When the scan starts, the sudden noise that results from the gradient switching often startles the patient, possibly causing him to move. As before, it would be advantageous to have such patient motion occur during acquisition of one of the off center cycles rather than at the zero encoding.

Of course, both of these problems can be overcome by applying "dummy" cycles before commencing actual data acquisition; i.e., running the scan but not storing the data. However, this method is wateful of valuable imaging time.

Data acquisition requires that the subject being imaged be placed in a strong static magnetic field. The static magnetic field aligns the protons of certain elements within the body. The most prevalent element subject to such alignment is hydrogen. The aligned proton are subjected to Rf pulses which nutate the aligned protons when the frequency of the Rf pulses is the Larmor frequency; i.e.:

$$f = B_0 \gamma / 2\pi$$

where:
$\gamma$ is a constant for each element,
$B_0$ is the strength of the magnetic field at the location of the proton being nutated, and
$\pi$ is the constant 3.1416+

Subsequent to the application of the Rf pulse, the nutated protons tend to dephase in the transverse plane and also to realign themselves with the magnetic field. The movements of the nutated protons generate what are known as free induction decay (FID) signals. These signals are proportional to the density of the nutated protons and are used as the raw data for reconstructing images. The raw data is transformed using two-dimensional Fourier transforms to obtain data for image pixels which correspond to locations in the subject.

The locations of the FID signals in the subject are obtained in a well known manner by applying gradient fields to the static magnetic field during the data acquisition process. The frequency of the received FID signals are a function of the strength of the magnetic field and the strength of the magnetic field is a function of location in the magnetic field along the X, Y and Z axes; therefore, the locations of the nutated protons are obtained from the frequencies of the received signals.

Three gradients are generally used. The are known as the select gradient Gz, the encoding gradient Gy and the viewing gradient Gx. In effect, each gradient field is used for determining one dimension of the three dimensions needed to locate the protons in a selected volume of the patient.

The encoding gradient is very often a phase gradient, that is the phase accumulated by the spins is varied by changing the amplitude of the gradient pulse at each application of the gradient. For example, in a 256×256 image, 256 such encoding gradient pulses of different amplitudes are applied for each of the other two gradients applied. In the prior art, the image reconstruction does not commence until at least half of the encoding pulses have been applied. In the past, in general, the first encoding gradient pulse applied was the maximum negative encoding gradient pulse followed by the maximum negative encoding gradient plus 1 and sequentially through the maximum positive encoding gradient.

As is well known, at the zero value of the encoding gradient, the received signal is generally largest, that is, most of the data is acquired. Thus, image reconstruction could not start until at least the zero encoding gradient pulse was applied i.e. until at least half the gradients were applied. Where only half the encoding gradients were used computations were necessary to construct the other half of the data.

If data reconstruction could be done on-line (that is on-the-fly) while the data acquisition is in process; then, it would be possible to save valuable throughput time. In contrast, following the prior art procedures, substantially all of the data is acquired before the image is constructed. Then, if the physician sees that the image is in the wrong place, for example, the whole process must be repeated and all of the acquisition and reconstruction time is wasted.

Where the image is constructed on the fly, valuable time is saved since the physician sees if the image is in the wrong place before the image is completed and accordingly he can restart the procedure and move the selected slice without having to wait for the entire data acquisition. Also for example, as the data acquisition proceeds the image becomes progressively clearer;

thus, the physician often obtains sufficient information prior to the acquisition of all of the data; thereby, saving more throughput time. Accordingly, it would be advantageous to process the data and reconstruct the image during the acquisition of the data. However, efforts to acquire data by starting acquisition from the center of the Fourier plane in the past resulted in serious artifacts.

Accordingly, it is an object of the present invention to provide methods for acquiring useable relatively artifact-free images on the fly in MRI systems.

BRIEF DESCRIPTION OF THE INVENTION

According to a broad aspect of the present invention, a method for acquiring data for use in reconstructing imgaes during data acquisition in magnetic resonance imaging systems is provided, said method comprising the steps of:

placing a subject for imaging in a large static magnetic field, scanning a selected section of said subject, by:

applying selecting gradient pulses during the application of RF excitation pulses to select a section of the subject for excitation, applying said RF excitation pulses to nutate protons in the selected section to thereby instigate the transmission of output signals from the selected section, locating the source of the output signals by:

applying a viewing gradient pulse during receipt of the output signals, applying a phase encoding pulse of a different amplitude or polarity prior to the receipt of each of said output signals, selecting the order of applying said phase encoding gradient pulses so that less significant data points are acquired during initially unstable MRI system response and more significant data points are acquired immediately after the system reaches stability to enable commencing construction of the image substantially before even half of the data is acquired without artifacts caused by initially unstable system response.

A feature of the invention includes the steps of:

initially applying said phase encoding gradient pulses removed from the zero amplitude value until the system stabilization and with the stabilization applying the phase encoding gradient pulses at the zero amplitude value and proximate thereto to maximize the amount of image data acquired early in the acquisition stages.

Another feature of the invention includes the steps of applying a first set of phase encoding pulses of alternate polarities having absolute amplitudes moving away from the zero amplitude value before stabilization followed by a second set of encoding pulses of alternate polarities having absolute amplitudes approaching zero and less than the absolute amplitudes of said first set of phase encoding gradient pulses.

Yet a further feature of the invention includes the steps of:

applying as a first phase encoding gradient pulse, a pulse having an amplitude of $-5$, applying gradient pulses sequentially from the $-5$ amplitude pulse through zero to the $+5$ amplitude pulse, subsequently applying a phase encoding gradient pulse of absolute amplitude 6 followed by the gradient pulse of absolute amplitude 6 and of the opposite sign, and continuing this procedure of applying pulses of opposite signs and increasing absolute amplitudes until the data desired has been acquired.

Alternatively, the invention features the steps of:

applying as a first phase encoding gradient pulse, a pulse having an amplitude of $-5$, applying succeeding phase encoding gradient pulses of alternate polarities and absolute amplitudes less than the absolute amplitudes of the previous pulse of the same polarity until the zero value phase encoding gradient pulse is applied, then applying a series of phase encoding gradient pulses of alternatively opposite polarities with absolute values moving away from zero.

The above named and other objects and features of the present invention will be better understood when considered in the light of the following detailed description of the invention made in conjunction with the accompanying drawings; wherein:

GENERAL DESCRIPTION

As in all medical imaging systems, signals in MRI systems are obtained which are functions of some morphological characteristic of the interior of the subject. The signal sources are located to enable reconstructing of the image by placing data proportional to the signals in pixel locations corresponding to the locations of the signal sources in the body. MRI systems utilize many techniques for deriving images from the measured proton density at different locations in the body. Thus, while the techniques and equipment described herein are preferred systems, many variations of the described techniques and equipment can be used within the scope of the invention.

Figure 1:
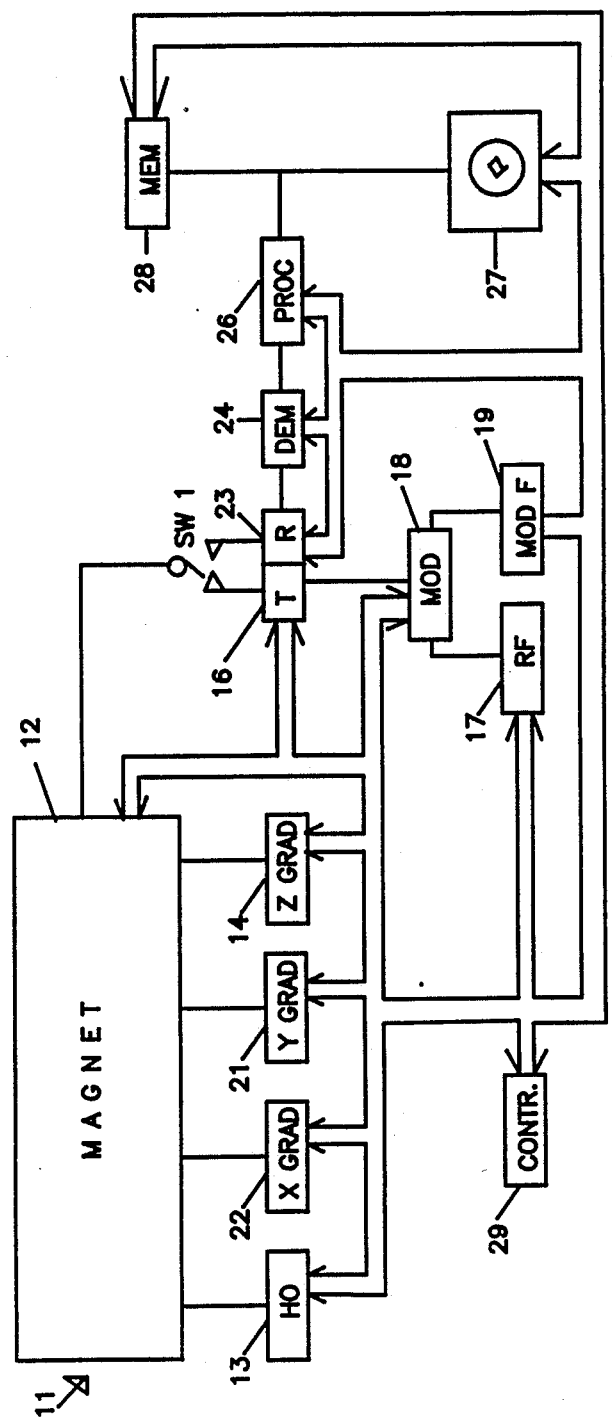
FIG. 1 is a generalized block diagram of an MRI system.

The MRI system 11 of FIG. 1 includes a large magnet 12 for generating the large static field. The large magnet may be a resistive magnet, a permanent magnet or a superconducting magnet within the scope of the invention. In a preferred embodiment, a superconducting magnet is used.

Means shown as block 13, labelled Ho, is used for initially generating the electric current that magnetizes the static magnet 12. The large static field causes the protons in the subject placed the magnet bore to align themselves in the direction of the static field.

Means are provided for selecting a portion in the subject for imaging. For example, a Z gradient current generator 14 is shown attached to the magnet. It generates the Z gradient current which when flowing through the Z gradient coils varies the magnetic field along the Z axis, enabling the selection of a planar portion of the subject parallel to the XY plane for imaging. It should be understood that while orthogonal planar portion selection is described herein the invention also encompasses line and/or volume portion selection as well as oblique selections.

Means are provided for nutating the protons of the Z gradient selected planar portion in the subject. More particularly, radio frequency (Rf) transmitter means 16 are shown coupled to the main magnet. The transmitter means, in a preferred embodiment transmits a shaped Rf pulse to Rf coils (not shown) in the main magnet. The Rf pulse is generated by Rf generator 17. The pulse is shaped by the modulator 18 through the use of a modulating frequency obtained from the modulating frequency generator 19.

Means such as Y gradient generator 21 and X gradient generator 22 are provided for obtaining proton density values for sections of the selected planar portion. The sections are defined by X, Y grids. In the preferred embodiment the X gradient is the viewing gradient i.e., applied during the receipt of the FID or echo signals. This causes the signal spectrum to be a projection of the plane on a line in the X direction.

In a preferred embodiment, proton density values for the grid sections in the Y direction are obtained from the spectrum of the received signal phases which are located in the grid in the Y direction according to Y encoding pulses applied in a spin echo procedure.

The data is collected as a function of time and converted to a frequency function by a two-dimensional Fourier transform operation. The transform pair is:

$$S(tx,ty) = \int_{-\infty}^{\infty} \int_{-\infty}^{\infty} \rho(wx,wy) e^{-iwxtx} e^{-Nwyty} \, dwxdwy$$

$$\rho(wx,wy) = \int_{-\infty}^{\infty} \int_{-\infty}^{\infty} (tx,ty) e^{iwxtx} e^{iwyty} \, dwxdwy$$

where S(tx,ty) are the pixel values on a two-dimensional time plane i.e. dimensions tx and ty, and
$\rho(\omega x,\omega y)$ are the proton densities defined for the Larmor frequencies determine by X and Y gradients respectively.

Thus, the pixel values where tx and ty are both equal to zero are:

$\int \int \rho(wx,wy)dxdy$ - generally a maximal value.

The time or phase of the encoding gradient in the Y direction is kept constant per cycle and then changed for the next cycle. In fact a cycle is usually defined by each encoding pulse, i.e., each change of the encoding pulse is another cycle. Each cycle provides specific values along the Y direction to locate the sources of the signals in the two dimensional Fourier plane.

It should be understood that while particular XY and Z gradients have been described this description is by way of example only. Thus the first gradient need not be the Z gradient; any of the gradients can be used for selecting the first plane or volumes, for encoding and for viewing.

Means are provided for receiving the signals. More particularly Rf coils (not shown) in the main magnet are energized by the FID or echo signals. These coils may be the same coils used for transmitting the Rf nutating pulse or they may be different coils. In a preferred embodiment the same coils are used and a switching arrangement shown as switch SW1 is used to selectively determine the function of the coils, i.e. either for transmitting or receiving. When the coils are used for receiving, switch SW1 connects the coils to receiver preamplifier and demodulator circuit. The output of the receiver circuit preamplifier 23 is shown as being coupled to demodulator 24. The output of the demodulator is coupled to an image processor 26.

The processor 26 processes the data to provide the data for the image shown on display unit 27 and/or for the memory 28. The processor is under the control of controller 29 which functions to control the timing and amplitudes of the various signals and gradients.

Figure 2:
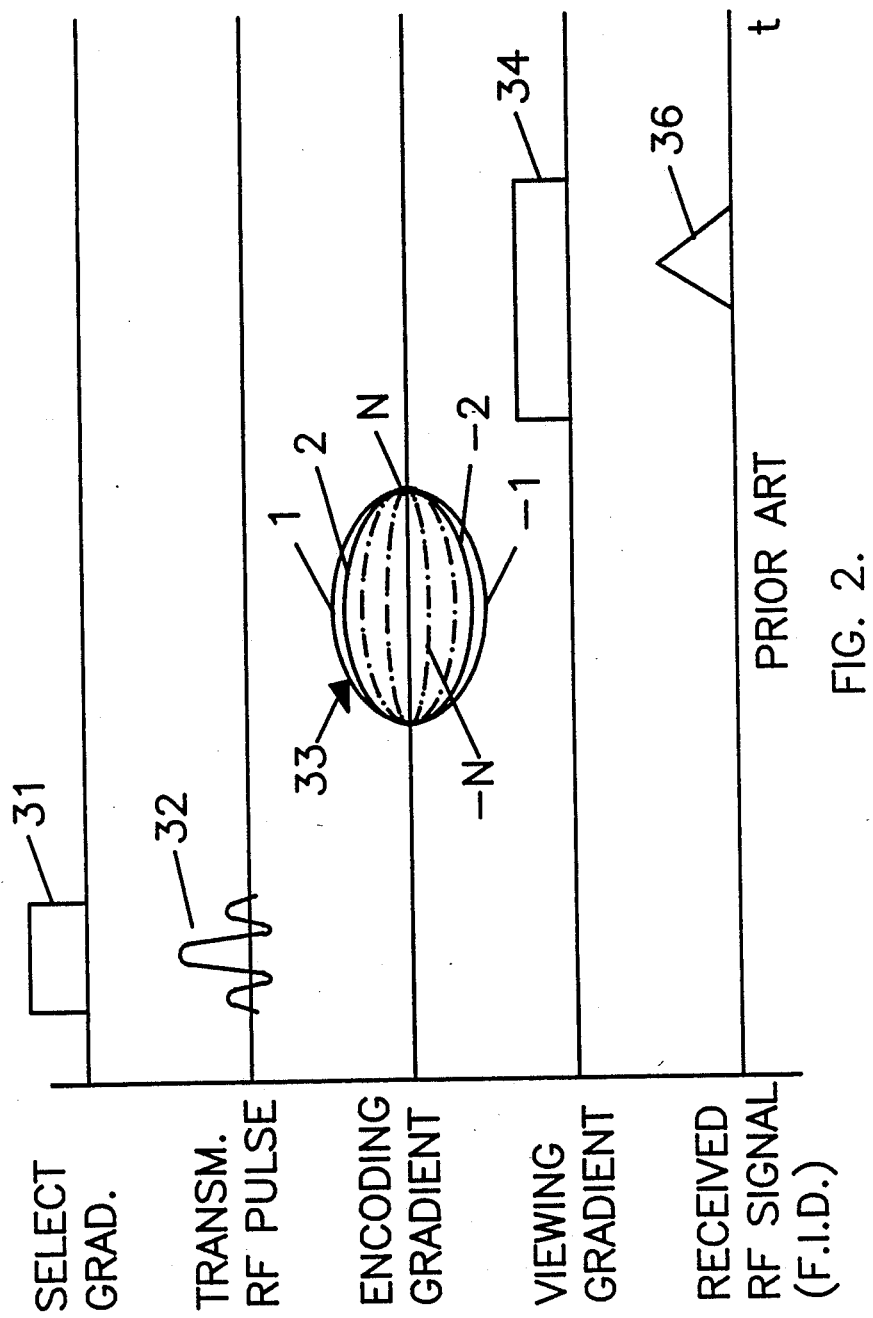
FIG. 2 is a graphical showing of a prior art data acquisition sequence in MRI systems.

FIG. 2 graphically shows a prior art sequence used for acquiring data in MRI systems. More particularly, a selecting gradient pulse 31 is shown. The transmitting Rf pulse 32 nutates the protons and is transmitted during the selecting gradient pulse 31. The transmission of the Rf pulse 32 during the selecting gradient selects a slab (or slice) along the Z axis having its major plane parallel to the XY plane.

In the prior art as shown the encoding gradient pulses are sequentially applied starting with the most negative pulse. The next encoding pulse is the most negative pulse plus 1. The third encoding pulse is the most negative pulse plus 2. This procedure continues until the most negative pulse plus 129 (the "o" pulse) is applied, for example, in a 256×256 matrix arrangement.

After the zero encoding pulse is transmitted then the next pulse transmitted is the positive one pulse up to the positive 128 pulse. Thus, since as is known, the largest signals are around the zero encoding locations, it is pointless to start processing the data for imaging purposes until substantially all of the data has been acquired. It is of course possible to use the data after half the data is acquired and make conjugation type computations to provide for the data that has not actually been acquired. However, this necessitates making certain assumptions and may have an adverse effect on the reliability and accuracy of the image.

Accordingly, in general in the prior art, imaging is not initiated until the acquisition of all of the data. The encoding gradient pulse are shown generally at 33. During the viewing gradient pulse 34, the received signal 36 is acquired. This signal 36 is the basis of the acquired data.

Figure 3:
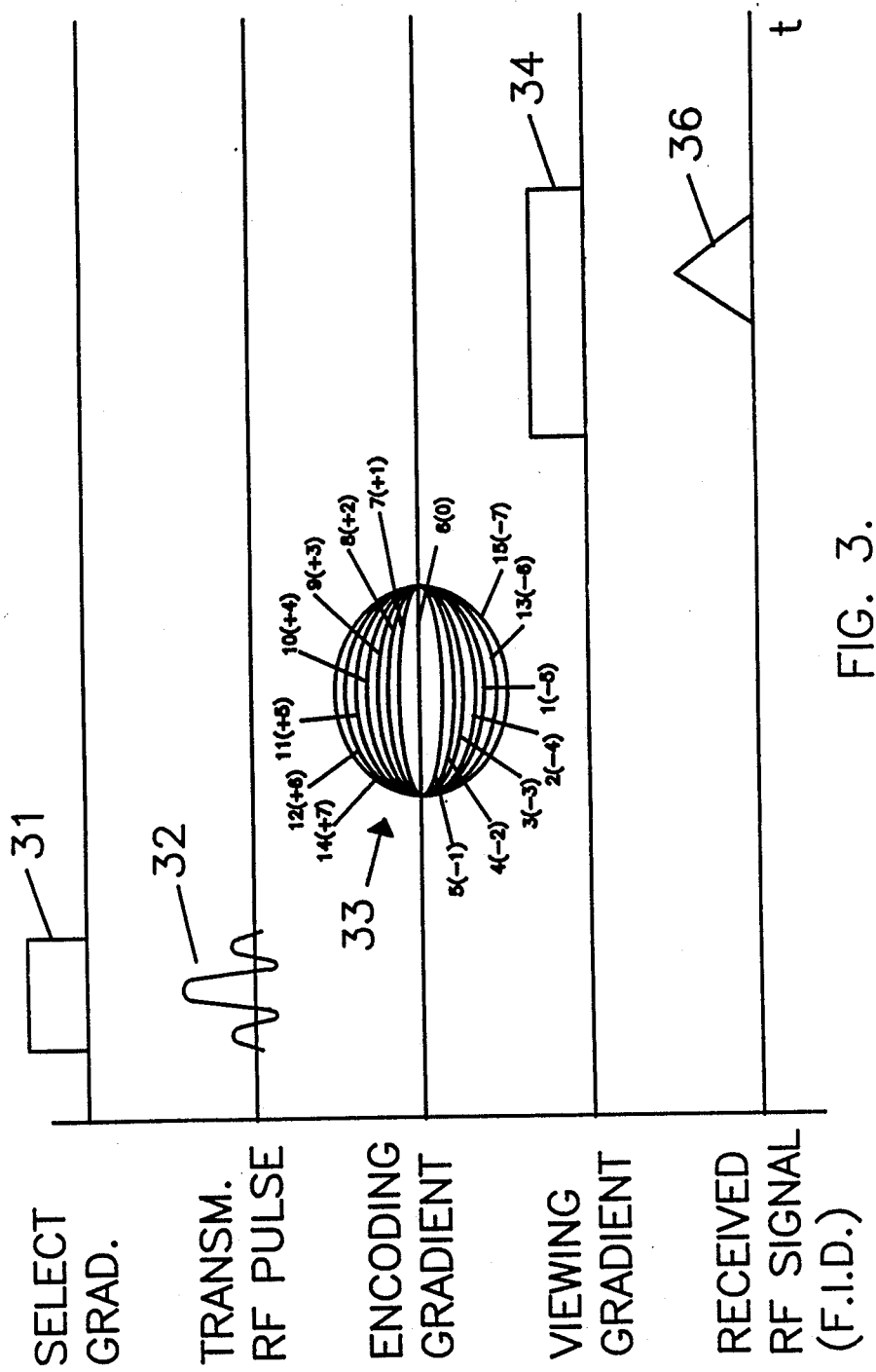
FIG. 3 is a graphical showing of a data acquisition sequence according to the present invention.

FIG. 3 illustrates a sequence of the invention that is the same as that of FIG. 2, except for the order of the encoding pulses. As shown in FIG. 3, the first encoding pulse designated 1 is sufficiently close to the zero encoding pulse to provide a relative large percentage of the image data but far enough away to avoid generating a bright line artifact appearing at edges of objects. In one preferred embodiment the phase encoding gradient pulse having an amplitude of −5 is used first. The second encoding pulse 2 is the −5 encoding pulse plus 1; i.e., the sequentially next encoding which is the phase encoding gradient pulse having an amplitude value of −4. The third encoding pulse 3 is the next sequential phase encoding gradient pulse on the way to the zero value phase encoding gradient. The first encoding pulse could be positive followed by a phase encoding pulse that is one less positive, etc., through the zero encoding value to the negative encoding pulse value.

After the first series of centrally located pulses then pulses of opposite signs or polarities are sequentially applied. These positive and negative pulses of increasing absolute amplitudes are applied to complete the encoding and the data acquisition. Note that within the scope of the invention the first series of pulses continue to be pulses of alternate polarities approaching zero value rather than sequential pulses first approaching zero then going away from zero. Also within the scope of the invention the pulses of opposite polarity could be applied to provide steps of two sequential pulses of the same polarity. Then each two sequential pulses of the opposite polarity will have different absolute amplitudes. Similarly, where each sequential pulse is of opposite polarity the pairs of pulses of opposite polarity will have the same magnitude.

Figure 4:
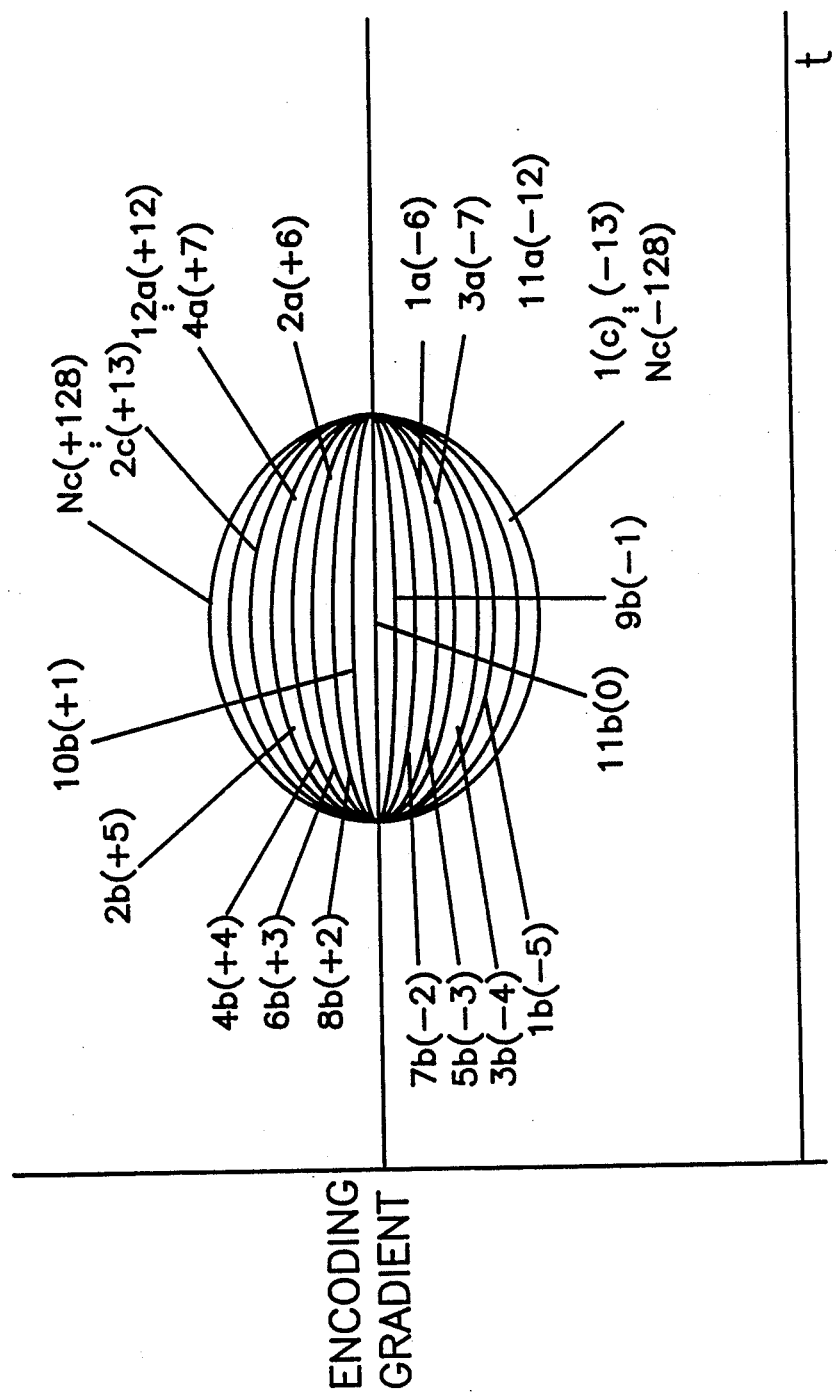
FIG. 4 shows another one of the many possible sequences of phase encoding gradient pulses for use in FIG. 3 according to the present invention.

In FIG. 3 and 4 the sequential order of the application of the phase encoding gradient pulses is shown by the numbers, etc. outside of parenthesis. The pulse amplitudes are indicated by the numbers in the parenthesis. The order and amplitudes shown indicate a method for increasing throughput that does not have adverse affects on signal-to-noise ratio, resolution or fidelity.

FIG. 4 illustrates a phase encoding gradient pulse sequence that is an alternative preferred embodiment to that shown in FIG. 3. In FIG. 4 the phase encoding gradient pulses are initially applied removed from the zero amplitude value until system stabilization. Thus the first pulses, for example, could be −6, +6, −7, +7 . . . i.e., moving away from the zero amplitude. The application of such pulses continues until stabilization. Then the pulses are applied in the large data regions. For example, −5, +5, −4, +4, −3, +3, −2, +2, −1, +1, and 0. After data from the large data regions are acquired then the pulses are applied to continue the first series of the pulses; i.e., increasing in absolute amplitude and of alternate polarities.

Thus, FIG. 4 shows a set of three series of phase encoding gradient pulses. The first set designated by "a" is applied prior to stabilization and comprises pulses of alternate polarity with absolute amplitudes increasing as compared to the prior pulse of the same polarity.

In the preferred embodiment of FIG. 4 the first pulse of the first series is designated as "1a" has an amplitude of (6) with a negative polarity, for example. The second pulse of the first series is designated 2a with its amplitude and polarity in parenthesis. The first series is shown as continuing to pulse amplitudes of −12 and +12.

The second series of pulses illustrated in FIG. 4 are designated by the letter "b". The first pulse is designated "1b" and has an amplitude of −5. The second pulse of the second series, pulse 2b has an amplitude of +5. This series approaches the zero phase encoding gradient pulse and applies that pulse. Thus, the next pulse in the series is shown as pulse 3b with an amplitude of −4. After the application of the zero value phase encoding gradient pulse a third series of phase encoding gradient pulses are applied. The pulses of the third series are designated by "c". The first pulse of the third series "1c" is shown as having an absolute amplitude larger than the last pulse of the first series. The next pulse of the third series of the same absolute amplitude but of opposite polarity. The subsequent pulse is shown as being of opposite polarities and larger than the previous pulse of the same polarity.

It should be understood that where opposite polarity pulses are shown the pulses could be in pairs of the same polarity followed by pairs of opposite polalrity with the last pulse of the pair of pulses of a given polarity being of large absolute value than the first pulse.

However, in either of the embodiments or in combinations and variations of the two embodiments image reconstruction can meaningfully be initiated during the receipt of even the first 24 pulses out of 256 pulses. The image at first is of very low resolution but increases in resolution as more data is acquired. The viewing physician can determine almost immediately whether or not the viewing plane or slice is in the desired position.

The viewing physician also may be able to determine information that he is looking for prior to acquisition of all of the data.

While the invention has been described using certain embodiments, it should be understood that these embodiments are shown and described as examples only and not as limitations to the scope of the invention.

What is claimed is:

1. A method for acquiring data for use in reconstructing images of sections of patients in magnetic resonance imaging (MRI) system, said method comprising the steps of:

placing a patient for imaging in a large static magnetic field, scanning a selected section of said patient by:

using selecting gradient pulses to select sections of the patient for imaging, applying radio frequency (RF) pulses to generate data signals in the selected sections, applying phase encoding gradient pulses of a different amplitude or polarity, prior to the receipt of each of said data signals to enable obtaining projections of the data signals in the direction of the phase encoding gradient, said phase encoding gradient pulses including pulses applied prior to system stabilization which are removed from the zero value, said phase encoding gradient pulses applied immediately subsequent to the stabilization being at and proximate to the zero value, applying viewing gradient pulses during the receipt of said data signals to enable obtaining projections of the signals in the direction of the viewing gradient, and reconstructing the image during the scan substantially before even half of the data has been acquired.

2. The method of claim 1 wherein the step of applying phase encoding gradient pulses comprises:

applying a first phase encoding gradient pulse removed from the zero value, decreasing the absolute magnitude of subsequently applied phase encoding gradient pulses relative to the last pulse of the same polarity until the zero value phase encoding pulse is applied, said first phase encoding gradient pulse being sufficiently removed from the zero value phase encoding gradient pulse so that phase encoding gradient pulses proximate to and at said zero value are applied only after the system stabilization.

3. The method of claim 2 wherein the step of decreasing the absolute magnitude of subsequently applied phase encoding pulses includes the steps of:

applying a first series of phase encoding gradient pulses including said first phase encoding gradient pulse and subsequent phase encoding gradient pulses of the same polarity and decreasing absolute magnitude until the zero phase encoding pulse is applied, then applying phase encoding gradient pulses of a polarity opposite to the polarity of the phase encoding pulses applied prior to the application of the zero value phase encoding gradient pulse and of increasing absolute magnitude, applying a second series of phase encoding gradient pulses of increasing absolute magnitudes relative to the last applied phase encoding gradient pulse of the same polarity and of opposite polarity relative to the last applied phase encoding gradient pulse of the same magnitude, said second series being applied after a phase encoding gradient pulse is applied that is of the same absolute magnitude as the first applied phase encoding gradient pulse.

4. The method of claim 1 wherein the step of applying said phase encoding gradient pulses comprises the steps of:
   using as the initial phase encoding pulse a pulse removed from the zero value,
   applying a first series of phase encoding gradient pulses of increasing absolute magnitude relative to the last pulse of the same polarity, and of opposite polarity relative to the last pulse of the same absolute magnitude,
   applying a second series of phase encoding gradient pulses which starts with a pulse of absolute magnitude value less than or equal to the absolute magnitude of the initial pulse, and continues with pulses sequentially proximate and equal to the zero value phase encoding gradient pulse, and
   applying a third series of pulses wherein the first pulse of the third series of pulses is larger than or equal in absolute magnitude to the last pulse of the first series and comprises pulses of alternate polarities relative to the last pulse of the same absolute magnitude and increased absolute magnitudes relative to the last pulse of the same polarity.

5. The method of claim 4 wherein the pulses sequentially proximate to the zero value comprise sequential pairs of pulses with each pulse of each sequential pair being of the same polarities but decreasing magnitude and each sequential pair of pulses being of opposite polarities.

6. The method of claim 4 wherein the pulses sequentially proximate to the zero value comprise sequential pairs of pulses with each pulse of each sequential pair being of the same absolute magnitude but opposite polarities.

7. The method claim 1 wherein the step of applying phase encoding gradient pulses comprises the steps of:
   applying a first series of sequential phase encoding gradient pulses starting with a first pulse having an absolute amplitude greater than zero, and
   continuing with each subsequent pulse being of opposite polarity relative to the last applied pulse of the same magnitude and decreasing in absolute magnitude relative to the last applied pulse of the same polarity until the zero value phase encoding gradient pulse is applied.

8. The method of claim 7 including the step of applying a second series of phase encoding gradient pulses, said second series comprising sequential phase encoding gradient pulses starting with a pulse having the absolute value of the first pulse plus one and continuing with pulses having opposite polarities and increasing in absolute magnitude compared to the last phase encoding gradient pulse of the same polarity.

9. The method of claim 1 wherein scanning the selected section of said subject comprises using a spin echo sequence.

10. The method of claim 1 wherein the data bearing signals are free induction decay signals (FID).

11. The method of claim 1 wherein reconstructing the image comprises the step of using two-dimensional Fourier and inverse transforms to obtain pixel values on a Fourier plane.

12. The method of claim 1 wherein said step of reconstructing the image comprises constantly regenerating an improved resolution image as the scan progresses.

13. A system for acquiring data for use in reconstructing images of sections of patients in magnetic resonance imaging (MRI) systems, said method comprising:
   a large static magnet for receiving a patient therein,
   means for scanning a selected section of said patient comprising:
   means for applying selecting gradient pulses to select sections of the patient for imaging,
   means for applying radio frequency (RF) pulses to generate data signals in the selected sections,
   means for applying phase encoding gradient pulses of a different amplitude or polarity, prior to the receipt of each of said data signals to enable obtaining projections of the data signals in the direction of the phase encoding gradient, said phase encoding gradient pulses including initial pulses removed from zero value applied prior to system stabilization and subsequent pulses at and proximate to the zero value applied immediately subsequent to the stabilization,
   means for applying viewing gradient pulses during the receipt of said data signals to enable obtaining projections of the signals in the direction of the viewing gradient, and
   means for reconstructing the image during the scan substantially before even half of the data has been acquired.

14. The system of claim 13 wherein the means for applying the initial phase encoding gradient pulses comprises:
   means for applying a first phase encoding gradient pulse removed from the zero value,
   means for decreasing the absolute magnitude of subsequently applied phase encoding gradient pulses relative to the last pulse of the same polarity until the zero value phase encoding pulse is applied, said first phase encoding gradient pulse being sufficiently removed from the zero value so that phase encoding gradient pulses proximate to and at the said zero value are applied only after the system stabilization.

15. The system of claim 14 wherein the step of decreasing the absolute magnitude of subsequently applied phase encoding pulses include:
   means for applying a first series of phase encoding gradient pulses including said first phase encoding gradient pulse and subsequent phase encoding gradient pulses of the same polarity and decreasing absolute magnitude until the zero phase encoding pulse is applied, followed by phase encoding gradient pulses of the opposite polarity to the phase encoding pulses applied prior to the application of the zero value phase encoding pulse and of increasing absolute magnitude,
   means for applying a second series of phase encoding gradient pulses increasing in absolute magnitudes relative to the last phase encoding gradient pulse of the same polarity and of opposite polarity relative to the last applied phase encoding gradient pulse of the same magnitude, said second series being applied after a phase encoding gradient pulse of the same absolute magnitude as said first phase encoding gradient pulse.

16. The system of claim 13 wherein said means for applying said phase encoding gradient pulses comprises:

means for applying an initial phase encoding gradient pulse having a value removed from zero value, means for applying a first series of phase encoding gradient pulses including said initial pulse, said first series comprising pulses of increasing absolute magnitude relative to the last pulse of the same polarity and of opposit polatity rtelative to last pulse of the same magnitude, means for applying a second series of phase encoding gradient pulses which starts with a pulse of absolute magnitude value less than or equal to the absolute magnitude of the initial pulse, and continues with pulses sequentially proximate to or at the zero value phase encoding gradient pulse, and means for applying a third series of pulses wherein the first pulse of the third series of pulses is larger in absolute magnitude than the last pulse of the first series, said third series comprising pulses of alternate polarities and increased absolute magnitudes relative to the last pulse of the same polarity.

17. The system of claim 16 wherein the pulses sequentially proximate to the zero value comprise sequential pairs of pulses with each pulse of each sequential pair being of the same polarities but decreasing magnitude and each sequential pair being of opposite polarities.

18. The system of claim 16 wherein the pulses sequentially proximate to the zero value comprise sequential pairs of pulses with each pulse of each sequential pair being of the same absolute magnitude but opposite polarities.

19. The system of claim 13 wherein the means for applying phase encoding gradient pules comprises:

means for applying a first series of sequential phase encoding gradient pulses starting with a first pulse having an absolute amplitude greater than zero, and continuing with each subsequent pulse being of opposite polarity relative to the last applied pulse of the same magnitude and decreasing in absolute magnitude relative to the last applied pulse of the same polarity until the zero value phase encoding gradient pulse is applied.

20. The method of claim 19 including means for applying a second series of phase encoding gradient pulses, said second series comprising sequential phase encoding gradient pulses starting with a pulse having the absolute value of the first pulse plus one and continuing with pulses having opposite polarities and increasing in absolute magnitude compared to the last applied phase encoding gradient pulse of the same polarity.

21. The system of claim 13 wherein said means for scanning the selected section of said patient comprises means for using a spin echo sequence.

22. The system of claim 13 wherein the data bearing signals are free induction decay signals (FID).

23. The system of claim 13 wherein said means for reconstructing the image comprises means for using two-dimensional Fourier and inverse transforms to obtain pixel values on a Fourier plane.

24. The system of claim 13 wherein said means of reconstructing the image comprises means for constantly regenerating an improved resolution image as the scan progresses.

* * * * *